(12) United States Patent
Wee et al.

(10) Patent No.: US 9,984,011 B2
(45) Date of Patent: May 29, 2018

(54) TERMINATION SCHEMES FOR MULTI-RANK MEMORY BUS ARCHITECTURES

(71) Applicant: QUALCOMM Incorporated, San Diego, CA (US)

(72) Inventors: Tin Tin Wee, San Diego, CA (US); Thomas Bryan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 15/368,445

(22) Filed: Dec. 2, 2016

(65) Prior Publication Data

US 2017/0351625 A1    Dec. 7, 2017

Related U.S. Application Data

(60) Provisional application No. 62/346,427, filed on Jun. 6, 2016.

(51) Int. Cl.
| | |
|---|---|
| *G06F 13/16* | (2006.01) |
| *G11C 11/401* | (2006.01) |
| *G06F 9/445* | (2018.01) |
| *G06F 13/40* | (2006.01) |
| *G06F 13/42* | (2006.01) |

(52) U.S. Cl.
CPC ...... *G06F 13/1694* (2013.01); *G06F 9/44505* (2013.01); *G06F 13/4086* (2013.01); *G11C 11/401* (2013.01); *G06F 13/4234* (2013.01)

(58) Field of Classification Search
CPC .................................................. G06F 13/4086
See application file for complete search history.

(56) References Cited

U.S. PATENT DOCUMENTS

| | | | |
|---|---|---|---|
| 6,127,849 A | 10/2000 | Walker | |
| 6,356,106 B1* | 3/2002 | Greeff | G06F 13/4086 326/30 |
| 6,359,815 B1 | 3/2002 | Sato et al. | |
| 6,525,618 B2 | 2/2003 | Wood | |
| 7,093,041 B2 | 8/2006 | Gasparik | |
| 9,614,703 B2 | 4/2017 | Rahman et al. | |
| 9,767,889 B1 | 9/2017 | Powers et al. | |
| 2003/0016550 A1* | 1/2003 | Yoo | G11C 7/10 365/63 |
| 2003/0161196 A1* | 8/2003 | Park | G06F 13/4086 365/200 |
| 2008/0031073 A1* | 2/2008 | Brandt | G11C 5/04 365/229 |
| 2011/0115307 A1 | 5/2011 | Yoshie | |
| 2014/0028607 A1 | 1/2014 | Tan et al. | |
| 2015/0205751 A1 | 7/2015 | Oh et al. | |
| 2017/0085403 A1 | 3/2017 | Sun et al. | |

OTHER PUBLICATIONS

International Search Report and Written Opinion—PCT/US2017/028655—ISA/EPO—dated Jul. 5, 2017.

* cited by examiner

*Primary Examiner* — Farley Abad
(74) *Attorney, Agent, or Firm* — Haynes and Boone, LLP

(57) ABSTRACT

A multi-rank memory bus architecture is provided in which an active DRAM is unterminated and an inactive DRAM terminates to increase the data eye width at the active DRAM.

21 Claims, 5 Drawing Sheets

TERMINATION SCHEMES FOR MULTI-RANK MEMORY BUS ARCHITECTURES

CROSS-REFERENCE TO RELATED APPLICATIONS

This application claims the benefit of U.S. Provisional Application No. 62/346,427, filed Jun. 6, 2016, the contents of which are incorporated herein in their entirety.

TECHNICAL FIELD

This application relates multi-rank memory bus architectures, and more particularly to non-uniform termination schemes for the multi-rank memories.

BACKGROUND

To provide reduced power consumption in the dynamic random access memory (DRAM) devices for the mobile market, various low power double data rate (LPDDR) DRAM standards have evolved in which the DRAM may vary the signaling voltage and data rate used to receive data from a transmitting device such as a system-on-a-chip (SoC). A communication channel extends between the SoC and the DRAM over which each bit is transmitted as either a binary high (logic one) symbol or a binary low (logic zero) symbol over the symbol interval. Each DRAM can selectively terminate (present a matched load) or non-terminate with regard to the communication channel. If a DRAM does not terminate, the input impedance to the DRAM is mismatched to the characteristic impedance of the communication channel. Conversely, if a DRAM does terminate, its input impedance is matched to the characteristic impedance of the communication channel.

The mismatched input impedance for a DRAM in a non-terminated mode of operation causes the data transmitted from the SoC to reflect back to the SoC. Such reflections are generally deemed to be undesirable such that it is conventional for the DRAM to active its termination during a high-speed data transmission mode. During a low-speed mode of operation, the DRAM may then deactivate its termination to save power since the matched load (e.g., a 50 ohm resistor) dissipates power to ground. Such termination is commonly implemented in multi-rank architectures in which the SOC couples to a plurality of DRAMs through a common communication channel. The common communication channel ends in one or more bifurcations so that each DRAM can couple to the common communication channel.

In a multi-rank memory bus architecture, the SoC writes to one DRAM at a time such that there is an active (being written to) DRAM and one or more inactive DRAMs (not being written to). In a high-speed mode of operation, it is conventional for the active DRAM to be terminated while the inactive DRAMs are non-terminated. But as data rates are increased higher and higher, it is becoming more difficult to maintain a sufficient data eye at the active DRAM.

Accordingly, there is a need in the art for improved termination schemes for multi-rank memory bus architectures.

SUMMARY

To provide an improved data eye at an active DRAM in a multi-rank memory bus architecture, the active DRAM does not terminate (couple a matching resistor to the multi-rank memory bus so as to provide a matching impedance) whereas an inactive DRAM(s) terminates. This is contrary to conventional practice of terminating the active DRAM so as to have a matched impedance but it is believed that the reflection of a received data signal at the non-terminated active DRAM increases the signal edge rate (the rate of change for the rising or falling edges for the transmitted data symbol) such that the data eye is improved at the non-terminated active DRAM. The termination of the inactive DRAM prevents additional reflections that could add with the reflection from the active DRAM and cause interference at the data source such as an SoC. If there are just two DRAMs in the multi-rank memory bus architecture, there would thus be a non-terminated active DRAM and a terminated inactive DRAM. In a higher-order multi-rank memory bus architecture having more than two DRAMs, the one or more additional inactive DRAMs in addition to the terminated inactive DRAM but the additional inactive DRAMs may be unterminated so as to reduce power consumption. Regardless of the multi-rank order, the resulting multi-rank memory bus architecture presents a non-uniform interface to the common communication data channel (the multi-rank memory bus) that couples the SoC to the DRAMs that is the opposite of the non-uniformity conventionally used yet substantially improves the data eye at the non-terminated active DRAM.

BRIEF DESCRIPTION OF THE DRAWINGS

Embodiments of the disclosed source-synchronous endpoints and their advantages are best understood by referring to the detailed description that follows. It should be appreciated that like reference numerals are used to identify like elements illustrated in one or more of the figures.

DETAILED DESCRIPTION

A multi-rank memory bus architecture is disclosed that provides a non-uniform interface for the DRAM endpoints. The following discussion will primarily address a multi-rank bus embodiment in which there are just two DRAMs but it will be appreciated that the concepts discussed herein are readily applied to higher-order multi-rank architectures. With regard to the pair of DRAMs, one of the DRAMs is designated herein to be an "active" DRAM if the data source endpoint (e.g., an SoC) is writing to the active DRAM over the multi-rank memory bus. The remaining non-written-to-DRAM is designated as the "inactive" DRAM. The identity of the active DRAM thus depends upon what DRAM is selected for a write operation by the data source endpoint.

The width of the data eye at the active DRAM is an important parameter with regard to preventing bit errors, particularly at higher data rates. To improve the data eye width at the active DRAM, the conventional practice of terminating the active DRAM is not used. In particular, each DRAM in the multi-rank memory bus architecture is configurable to selectively present a matched resistive termination to the multi-rank memory bus such that the multi-rank memory bus couples to ground through the resistive termination (matched load resistor). The impedance of the matched load resistor depends upon the characteristic impedance of the multi-rank memory bus, which is assumed herein to be 50 ohms without loss of generality. If the matched load resistor is not selected, the DRAM is non-terminated such that it presents an unmatched load of, for example, one pF to the multi-rank memory bus.

To improve the data eye at the active DRAM, the active DRAM does not terminate whereas the inactive DRAM does terminate. Note that a current data bit may be the complement of the preceding data bit and also the complement of the subsequent data bit. Such a current data bit will be demarcated from the preceding and subsequent data bits by either rising edges or falling edges with regards to the signaling voltage. For example, a binary one current data bit in such a scenario would begin with a rising edge up to the maximum signaling voltage and end with a falling edge back to ground. Conversely, a binary zero current data bit would begin with a falling edge and end with a rising edge. It is believed that, contrary to conventional teachings, the reflection of the current data bit as caused by the mismatch of the active DRAM to the multi-rank memory bus causes these rising or falling edges to increase their rate of change (steeper rising or falling edges). This increased rate of change causes the data eye for the current data bit at the active DRAM to be wider than would be the case if the active DRAM were terminated. The reflected signal edge from the active DRAM propagates to the inactive DRAM. To minimize another reflection from the inactive DRAM of the reflected signal edge from the active DRAM, the inactive DRAM is terminated.

Figure 1A:
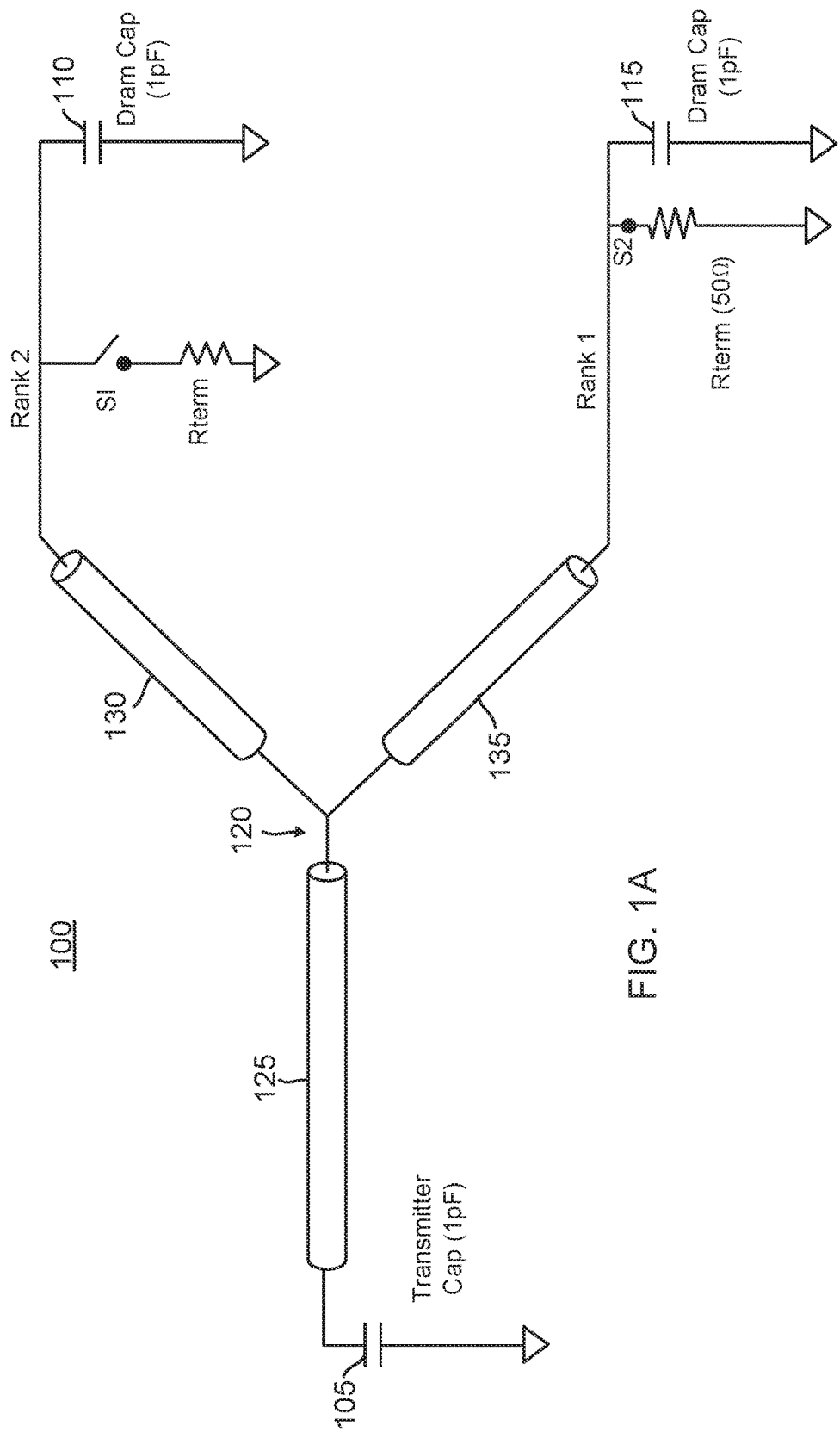
FIG. 1A is a circuit diagram of a multi-rank memory bus architecture including two DRAMs in accordance with an aspect of the disclosure.

An example multi-rank memory architecture 100 is shown in FIG. 1A. An SoC 105 is represented by its parasitic capacitance (e.g., one pF). Similarly, a rank 1 DRAM 115 and a rank 2 DRAM 110 are both represented by their parasitic capacitances of 1 pF. Such parasitic capacitance values are typical for actual devices but it will be appreciated that such values are merely representative. A multi-rank memory bus 120 provides a common data channel over which SoC 105 may write to an active one of DRAMs 110 and 115. DRAMS 110 and 115 may each be low power double data rate (LPDDR) DRAMs. Each DRAM includes a switch (for example, a metal oxide semiconductor field effect transistor (MOSFET) switch) so that it may selectively terminate with respect to multi-rank memory bus 120. For example, DRAM 110 includes a switch S1 that when closed presents a matched termination resistor Rterm (e.g., 50 ohms) to multi-rank memory bus 120. Similarly, DRAM 115 includes a switch S2 that when closed presents another matched termination resistor Rterm to multi-rank memory bus 120. Each switch is in series with its corresponding termination resistor. For example, switch S1 couples between multi-rank memory bus 120 and a terminal of the corresponding matched termination resistor. A remaining terminal of the corresponding matched termination resistor couples to ground. However, it will be appreciated that this switch/resistor serial arrangement may be reversed such the matched termination resistor is the component that couples to multi-rank memory bus 120. In such an implementation, switches S1 and S2 couple to ground when closed.

The control of the switches may be commanded by each DRAM or by the source endpoint (SoC 105). Regardless of the origin of the switch control, a DRAM's switch is open if it is the active DRAM and is closed if it is the inactive DRAM. In this example, DRAM 110 is the active DRAM that is being written to by SoC 105 so that its switch S1 is open. Since DRAM 115 is inactive, its switch S2 is closed. The resulting lack of termination at active DRAM 110 is counterintuitive in that the conventional practice would be for active DRAM 110 to be the terminated DRAM whereas inactive DRAM 115 would be non-terminated. Since active DRAM 110 is non-terminated, its parasitic capacitance of 1 pF is mismatched to the 50 ohm characteristic impedance of multi-rank memory bus 120. This mismatch causes a reflection that simulation results show will increase the rate of change for the rising and falling edges of the current data bit being received at active DRAM 110 such that the resulting data eye for active DRAM 110 is significantly improved as compared to conventional practice.

Due to the bifurcation of multi-rank memory bus 120, it will have a common bus portion (portion 125 that couples to SoC 105) and also an individual bus portion 130 that couples only to DRAM 110 and an individual bus portion 135 that couples only to DRAM 115. Common portion 125 carries the signaling for both DRAM 110 and 115. In contrast, individual bus portion 130 carries only the signaling for DRAM 110. Similarly, individual bus portion 135 carries only the signaling for DRAM 115. Common portion 125 is typically substantially longer than the individual bus portions 130 and 135. For example, DRAMs 110 and 115 may be adjacent to each other in a package-on-package (POP) configuration as explained further herein. The reflection from active DRAM 110 will thus propagate strongly to inactive DRAM 115 due to the relatively short propagation lengths on the individual portions of the multi-rank memory bus 120. Although the reflection at active DRAM 110 is beneficial to its data eye, it is not beneficial after it propagates to inactive DRAM 115. This reflection may be further inhibited with inductive terminations as discussed further herein.

Figure 1B:
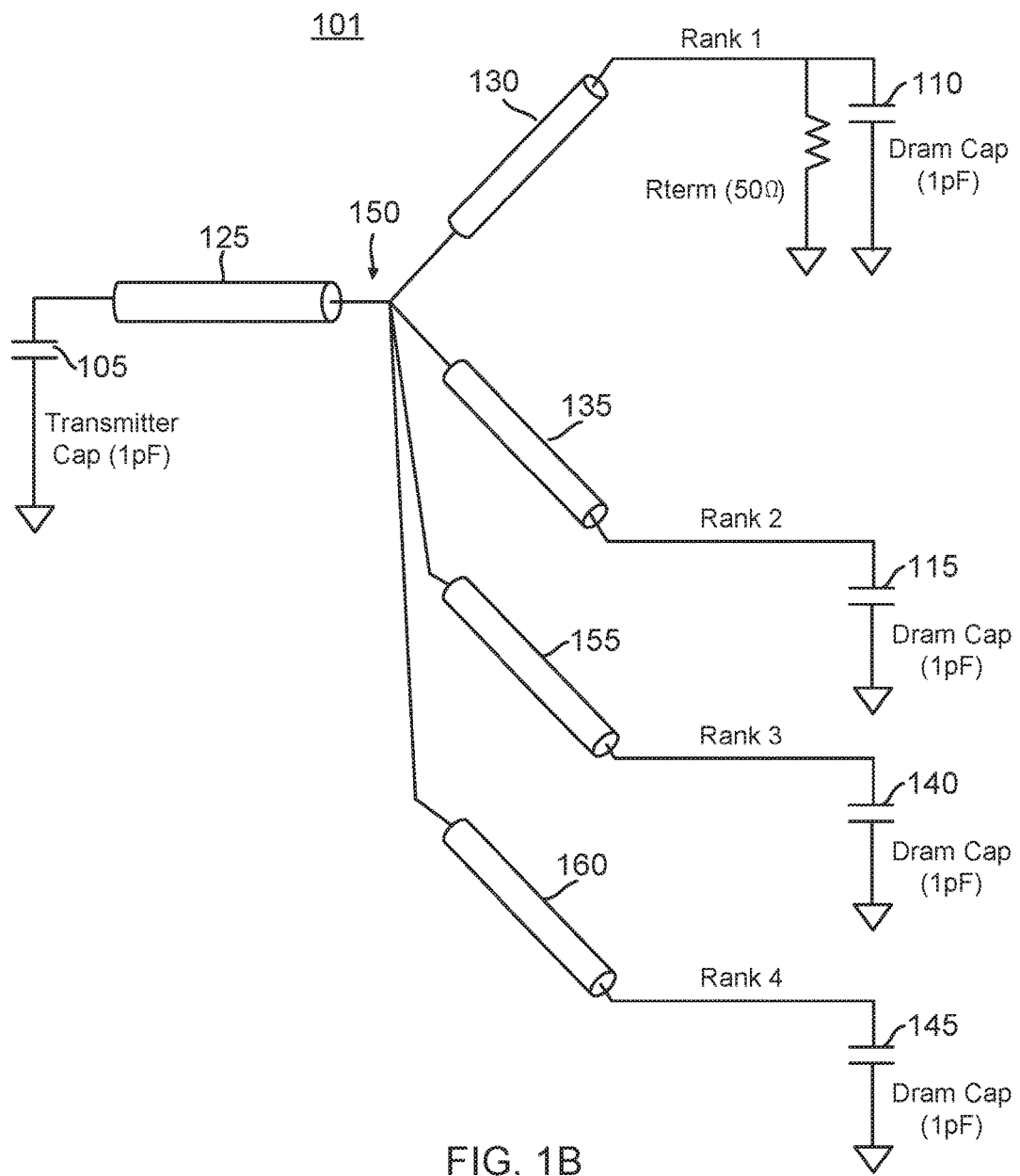
FIG. 1B is a circuit diagram of a multi-rank memory bus architecture including two DRAMs in accordance with an aspect of the disclosure.

An example higher-order multi-rank memory bus architecture 101 is shown in FIG. 1B. SoC 115, DRAM 110, and DRAM 115 are as discussed with regard to architecture 100 except that DRAM 115 is the active DRAM such that it is unterminated whereas DRAM 110 is inactive and thus terminated. Since architecture 101 is higher-order, it includes more than just two DRAMs. In particular, a rank 3 DRAM 140 couples to a multi-rank memory bus 150 through an individual bus portion 155. Similarly, a rank 4 DRAM 145 couples to multi-rank memory bus 150 through an individual bus portion 160. Like DRAM 110, DRAMs 140 and 145 are inactive. But note that if these additional DRAMs terminate, their termination resistors with couple in parallel with the termination resistor for DRAM 110. Should the termination resistance be 50 ohms, the effective termination resistance presented to data signals from SoC would then be 50/3=16.67 ohms. Such a relatively low resistance would undesirably consume power. Thus, additional inactive DRAMs 140 and 145 do not terminate in one implementation such that only a single inactive DRAM (DRAM 110 in this case) would be terminated in a higher-order architecture. Note that individual bus portions 130, 135, 155, and 160 are relatively short as compared to common bus portion 125. Thus, the reflection from active DRAM 115 will be quickly damped by the termination resistor for inactive DRAM 110 despite the lack of termination at inactive DRAMs 140 and 145.

Figure 2:
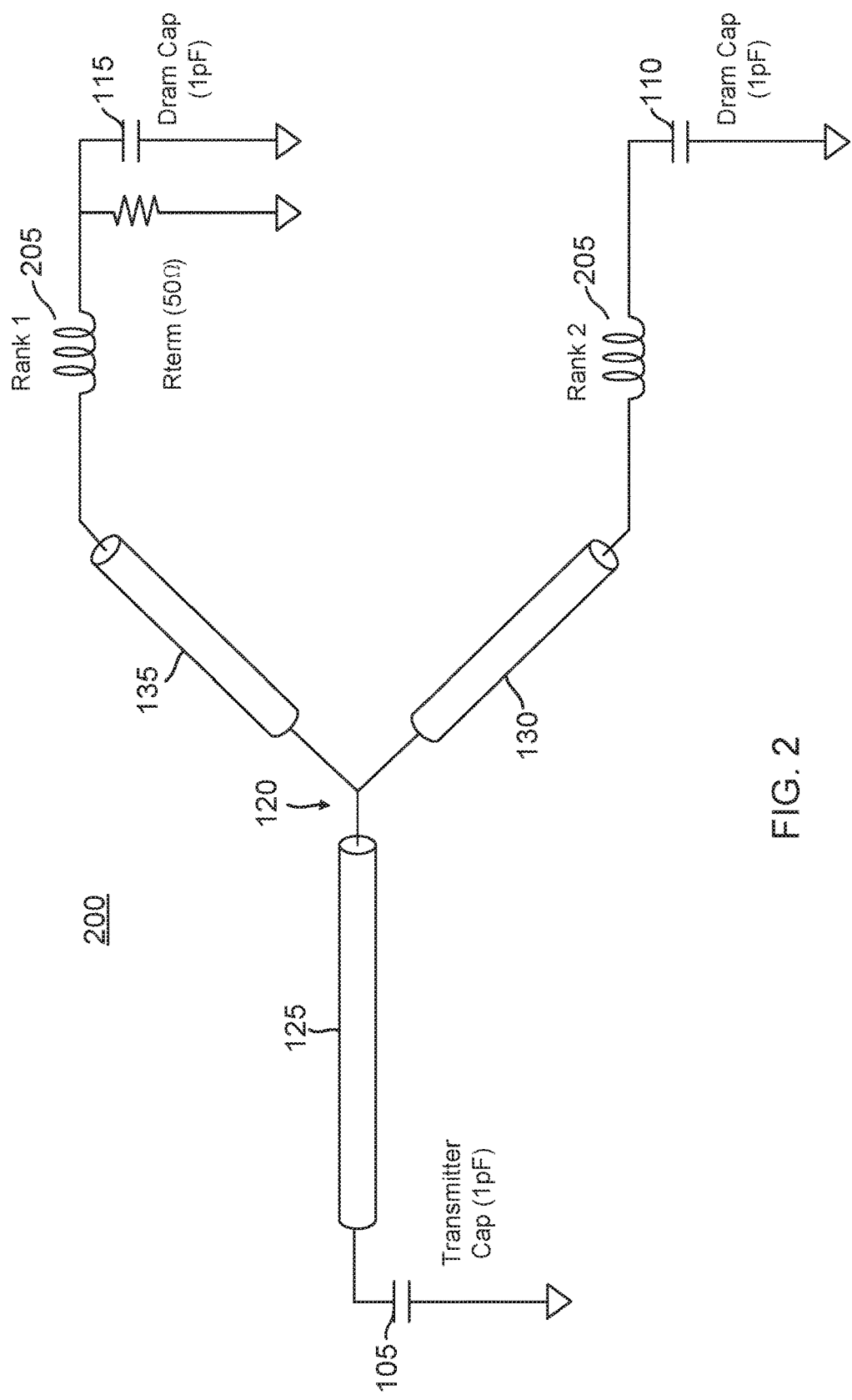
FIG. 2 is a circuit diagram of a multi-rank memory bus architecture including inductive terminations in accordance with an aspect of the disclosure.

To further inhibit the propagation of the reflection between the memory ranks, an inductance termination may be added to the distal end of the individual bus portions at their junctions with the corresponding DRAMs. An example multi-rank memory bus architecture 200 is shown in FIG. 2. Architecture 200 is the same as discussed with regard to architecture 100 except for the addition of an inductor 205 (e.g., 0.25 nH) between active DRAM 110 and its individual bus portion 130 and also another inductor 205 between inactive DRAM 115 and its individual bus portion 135. Such inductances may be formed by the wire bonding of DRAMs 110 and 115 to a suitable substrate such as the top package substrate in a package-on-package (POP) in which the bottom package substrate contains SoC 105 as discussed further herein. Note that if the inductances are too large, they would potentially block the transmitted data edges from SoC 105. Thus, the inductance values represent a compromise between blocking reflections between the memory ranks while promoting the propagation of the rising and falling edges from SoC 105 to the memory ranks.

Figure 3:
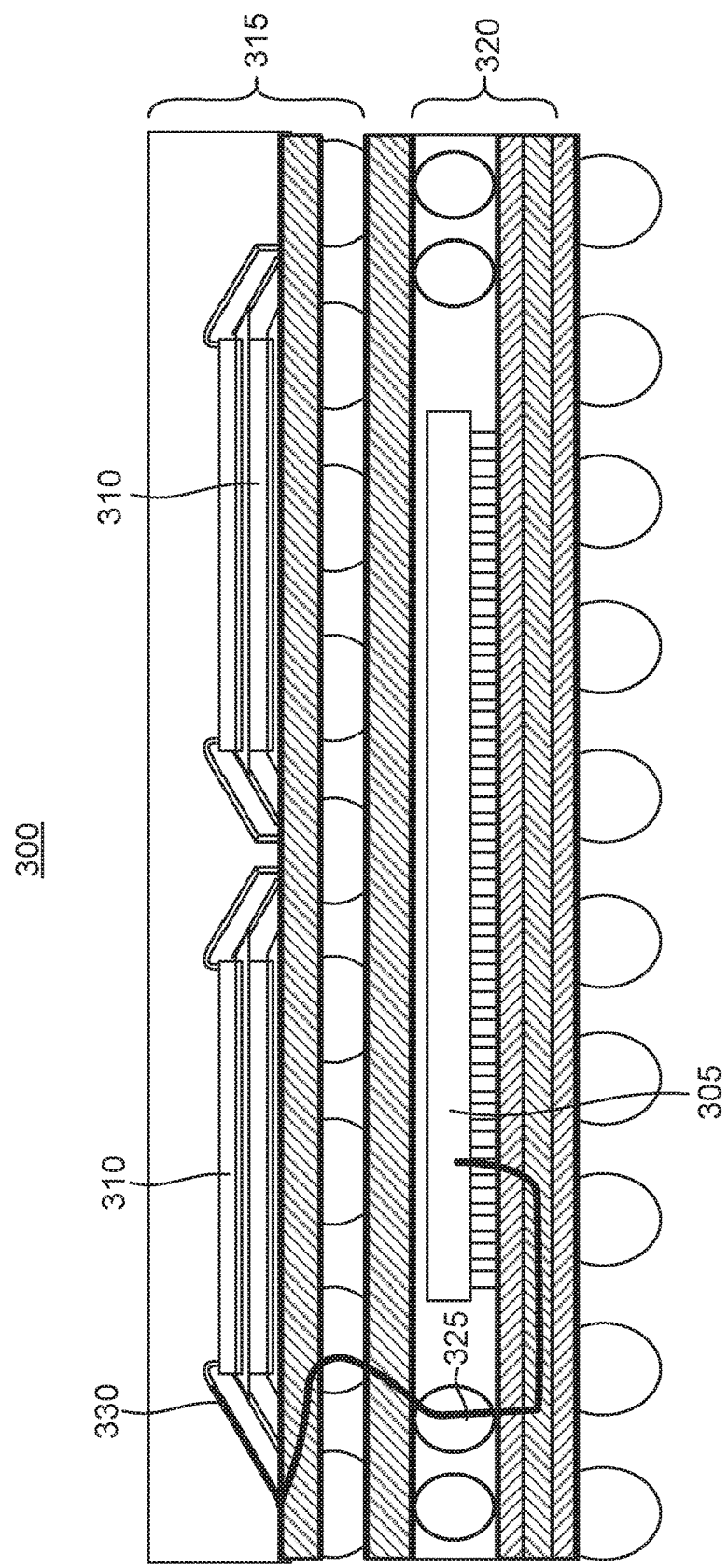
FIG. 3 is a diagram of a package-on-package including a multi-rank memory bus architecture in accordance with an aspect of the disclosure.

An example package-on-package (PoP) integrated circuit package 300 including a multi-rank memory bus architecture is shown in FIG. 3. A bottom package 300 includes an SoC 305 whereas a bottom package 315 includes four DRAMs 310. As known in the PoP arts, each package 300 and 315 includes a substrate such as an organic substrate having metal layers that are patterned to form the desired multi-rank memory bus. A propagation path 325 in the multi-rank memory bus extends from SoC 305 to an active one of DRAMs 310. Referring again to architecture 200, it may thus be readily appreciated that a common bus portion (not illustrated) of the multi-rank memory bus would be considerably longer than the individual bus portions for DRAMs 310. The reflections between the various DRAMs 310 will thus be more pronounced as compared reflections between SoC 105 and DRAMs 310. Wire bonds 330 that couple DRAMs 310 to the substrate in top package 315 thus are also configured to function as inductors to inhibit reflections from one DRAM to another.

Figure 4:
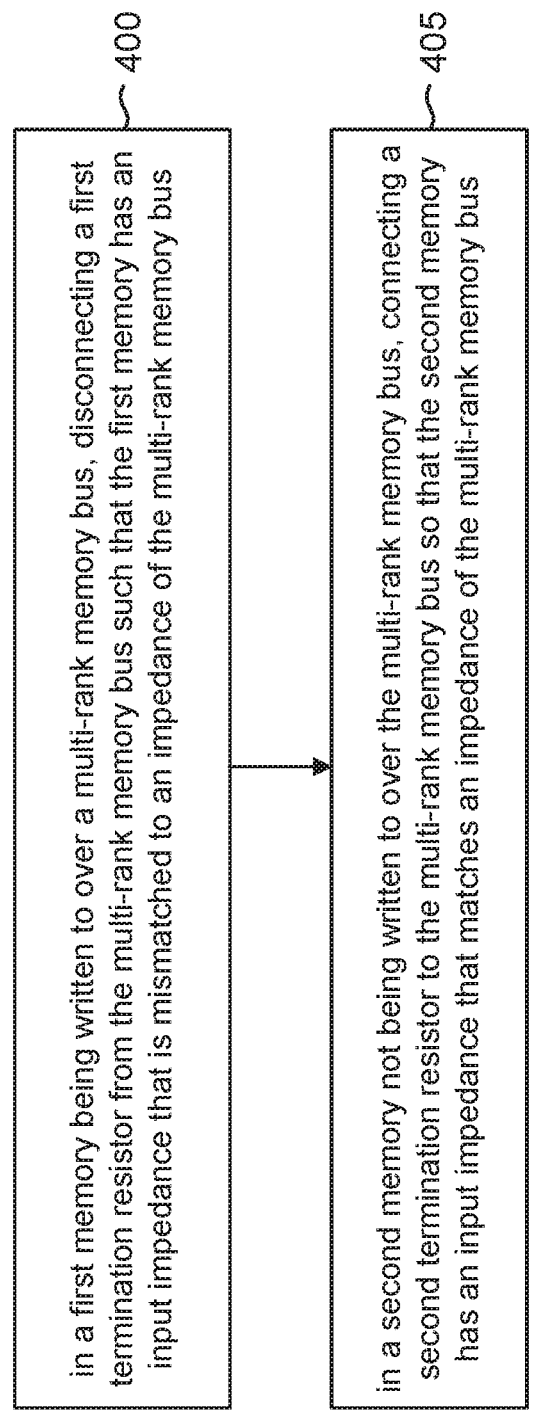
FIG. 4 is a flowchart for a method of operation for a a multi-rank memory bus architecture in accordance with an aspect of the disclosure.

A method of operation for a multi-rank memory bus architecture will now be discussed with regard to the flowchart of FIG. 4. The method includes an act 400 of, in a first memory being written to over a multi-rank memory bus, disconnecting a first termination resistor from the multi-rank memory bus such that the first memory has an input impedance that is mismatched to an impedance of the multi-rank memory bus. The opening of switch S1 for inactive DRAM 110 as discussed with regard to FIG. 1 is an example of act 400. The method also includes an act 405 of, in a second memory not being written to over the multi-rank memory bus, connecting a second termination resistor to the multi-rank memory bus so that the second memory has an input impedance that matches an impedance of the multi-rank memory bus. The closing of switch S2 in inactive DRAM 115 as discussed with regard to FIG. 1 is an example of act 405.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A memory configured to receive data from a multi-rank memory bus, the memory comprising:
   a resistor matched to an impedance of the multi-rank memory bus; and
   a switch coupled to a terminal of the resistor, wherein the switch and resistor are configured to couple the multi-rank memory bus to ground through the resistor while the switch is closed and to isolate the multi-rank bus from the resistor while the switch is open, and wherein the memory is configured to close the switch while the memory is not being written to by a data source endpoint and to open the switch while the memory is being written to by the data source endpoint.

2. The memory of claim 1, wherein the memory is a dynamic random access memory (DRAM).

3. The memory of claim 2, wherein the DRAM is an LPDDR DRAM.

4. The memory of claim 1, wherein the resistor is a 50 ohm resistor.

5. The memory of claim 1, further comprising an inductor coupled between the multi-rank memory bus and the memory.

6. The memory of claim 5, wherein the inductor comprises a wire bond in a package-on-package integrated circuit package.

7. The memory of claim 1, wherein the resistor is coupled to ground, and wherein the switch couples between the multi-rank memory bus and the resistor.

8. The memory of claim 1, wherein the resistor is coupled to the multi-rank memory bus, and wherein the switch couples between ground and the resistor.

9. The memory of claim 1, wherein the switch is a MOSFET switch.

10. A method of receiving data at a memory over a multi-rank memory bus, comprising:
    in a first memory being written to over the multi-rank memory bus, disconnecting a first termination resistor from the multi-rank memory bus such that the first memory has an input impedance that is mismatched to an impedance of the multi-rank memory bus; and
    in a second memory not being written to over the multi-rank memory bus while the first memory is being written to, connecting a second termination resistor to the multi-rank memory bus so that the second memory has an input impedance that matches an impedance of the multi-rank memory bus.

11. The method of claim 10, wherein disconnecting the first termination resistor comprises opening a switch coupled between the first termination resistor and ground.

12. The method of claim 11, wherein opening the switch comprises switching off a metal oxide semiconductor transistor (MOSFET).

13. The method of claim 10, wherein connecting the second termination resistor comprises closing a switch coupled between the second termination resistor and ground.

14. The method of claim 13, wherein closing the switch comprises switching on a metal oxide semiconductor transistor (MOSFET).

15. The method of claim 10, further comprising inhibiting a reflection of a transmitted bit at the first memory from propagating down the multi-rank memory bus to the second memory by propagating the reflection of the transmitted bit through a first inductor coupled between the multi-rank memory bus and the first memory.

16. The method of claim 15, further comprising inhibiting the reflection of the transmitted bit at the first memory by propagating the reflection of the transmitted bit through a second inductor coupled between the multi-rank memory bus and the second memory.

17. A package-on-package (PoP), comprising;
a bottom package including a system-on-a-chip (SoC);
a top package including a first dynamic random access memory (DRAM) and a second DRAM, wherein the first DRAM and the second DRAM are both coupled to the SoC by a multi-rank memory bus extending through the top package and the bottom package and wherein both the first DRAM and the second DRAM include a corresponding termination resistor, and wherein the first DRAM and the second DRAM are each configured to couple their corresponding termination resistor between ground and the multi-rank memory bus while being written to by the SoC and to disconnect their corresponding termination resistor from ground while not being written to by the SoC.

18. The PoP of claim 17, further comprising a third DRAM and a fourth DRAM, wherein the third DRAM and the fourth DRAM are both coupled to the multi-rank memory bus and both include a corresponding termination resistor, and wherein the third DRAM and the fourth DRAM are both configured to disconnect their corresponding termination resistor from ground while not being written to by the SoC and while one of the first DRAM and the second DRAM couples their corresponding termination resistor between ground and the multi-rank memory bus.

19. The PoP of claim 18, wherein the first DRAM, the second DRAM, the third DRAM, and the fourth DRAM are each a low power double data rate (LPDDR) DRAM.

20. The PoP of claim 17, wherein the first DRAM and the second DRAM each includes a switch for coupling the corresponding resistor to ground.

21. The PoP of claim 20, wherein the switch for first DRAM and the switch for the second DRAM each comprises a MOSFET switch.

* * * * *